United States Patent
Yang

(10) Patent No.: US 11,086,567 B2
(45) Date of Patent: Aug. 10, 2021

(54) FLASH MEMORY CONTROLLER, FLASH MEMORY MODULE AND ASSOCIATED ELECTRONIC DEVICE

(71) Applicant: Silicon Motion Inc., Hsinchu County (TW)

(72) Inventor: Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/505,725

(22) Filed: Jul. 9, 2019

(65) Prior Publication Data
US 2020/0026471 A1    Jan. 23, 2020

Related U.S. Application Data
(60) Provisional application No. 62/700,345, filed on Jul. 19, 2018.

(51) Int. Cl.
| | |
|---|---|
| *G06F 3/06* | (2006.01) |
| *G11C 11/56* | (2006.01) |
| *G11C 16/04* | (2006.01) |
| *G11C 16/10* | (2006.01) |
| *G11C 16/26* | (2006.01) |

(52) U.S. Cl.
CPC .......... *G06F 3/0659* (2013.01); *G06F 3/0604* (2013.01); *G06F 3/064* (2013.01); *G06F 3/0679* (2013.01); *G06F 3/0688* (2013.01); *G11C 11/5621* (2013.01); *G11C 11/5628* (2013.01); *G11C 11/5642* (2013.01); *G11C 16/0483* (2013.01); *G11C 16/10* (2013.01); *G11C 16/26* (2013.01); *G11C 2216/14* (2013.01)

(58) Field of Classification Search
None
See application file for complete search history.

(56) References Cited

U.S. PATENT DOCUMENTS
| | | |
|---|---|---|
| 7,460,403 B2 | 12/2008 | Lee |
| 7,843,727 B2 | 11/2010 | Cho |
| 7,898,864 B2 | 3/2011 | Dong |
| 8,782,496 B2 | 7/2014 | Sakaue |
| 8,990,665 B1 * | 3/2015 | Steiner ................ G11C 11/5642 714/769 |
| 9,177,664 B2 | 11/2015 | Yang |

(Continued)

FOREIGN PATENT DOCUMENTS
| | | |
|---|---|---|
| CN | 1330467 A | 1/2002 |
| CN | 101165807 A | 4/2008 |

(Continued)

*Primary Examiner* — Charles Rones
*Assistant Examiner* — Ryan Dare
(74) *Attorney, Agent, or Firm* — Winston Hsu

(57) ABSTRACT

The present invention provides a method for accessing a flash memory module, wherein the flash memory module comprises at least one flash memory chip, each flash memory chip comprises a plurality of blocks, each block comprises a plurality of pages, and the method comprises: sending a read command to the flash memory module to ask for data on at least one memory unit; and analyzing state information of a plurality of memory cells of the memory unit based on information from the flash memory module to determine a decoding method adopted by a decoder.

18 Claims, 15 Drawing Sheets

(56) References Cited

U.S. PATENT DOCUMENTS

| | | |
|---|---|---|
| 9,502,127 B2 | 11/2016 | Zhang |
| 9,703,494 B1 | 7/2017 | Rajwade |
| 10,062,441 B1 | 8/2018 | Vali |
| 2007/0118786 A1 | 5/2007 | Lim |
| 2007/0153574 A1 | 7/2007 | Kouno |
| 2013/0073924 A1 | 3/2013 | D'Abreu |
| 2013/0094289 A1 | 4/2013 | Sridharan |
| 2013/0304977 A1 | 11/2013 | Yang |
| 2014/0029355 A1 | 1/2014 | Choi |
| 2014/0043903 A1 | 2/2014 | Ok |
| 2014/0281771 A1 | 9/2014 | Yoon |
| 2014/0359346 A1 | 12/2014 | Chen |
| 2015/0049547 A1 | 2/2015 | Kim |
| 2016/0034349 A1 | 2/2016 | Choi |
| 2016/0372186 A1 | 12/2016 | You |
| 2017/0047114 A1 | 2/2017 | Song |
| 2017/0371565 A1 | 12/2017 | Liu |
| 2018/0048329 A1 | 2/2018 | Ha |
| 2018/0102790 A1 | 4/2018 | Oh |
| 2018/0158493 A1 | 6/2018 | Ryu |
| 2018/0261292 A1 | 9/2018 | Helm |
| 2019/0004938 A1 | 1/2019 | Siciliani |
| 2019/0227743 A1 | 7/2019 | Hamilton |
| 2019/0235954 A1 | 8/2019 | Gim |

FOREIGN PATENT DOCUMENTS

| | | |
|---|---|---|
| CN | 102098133 A | 6/2011 |
| CN | 102203875 A | 9/2011 |
| CN | 102655021 A | 9/2012 |
| CN | 104052498 A | 9/2014 |
| CN | 104601178 A | 5/2015 |
| CN | 104851458 A | 8/2015 |
| CN | 105679364 A | 6/2016 |
| TW | 201405562 A | 2/2014 |
| TW | 201405568 A | 2/2014 |
| TW | 201635307 A | 10/2016 |
| TW | 201714094 A | 4/2017 |
| WO | 2012/102785 A2 | 8/2012 |

* cited by examiner

FLASH MEMORY CONTROLLER, FLASH MEMORY MODULE AND ASSOCIATED ELECTRONIC DEVICE

CROSS REFERENCE TO RELATED APPLICATIONS

This application claims the priority of US Provisional Application No. 62/700,345, filed on Jul. 19, 2018, which is included herein by reference in its entirety.

BACKGROUND OF THE INVENTION

1. Field of the Invention

The present invention relates to access control of flash memory, and more particularly, to a method for performing access management of a flash memory module and associated flash memory controller and electronic device.

2. Description of the Prior Art

Developments in memory technology have led to the wide application of portable or non-portable memory devices, such as memory cards which conform to the SD/MMC, CF, MS and XD specifications, respectively, solid state drives (SSDs), or embedded memory devices which conform to the Universal Flash Storage (UFS) and embedded Multi Media Card (eMMC) specifications, respectively. Improving access control of memories in these memory devices remains an issue to be solved in the art.

NAND flash memories may comprise single level cell (SLC) and multiple level cell (MLC) flash memories. In an SLC flash memory, each transistor used as a memory cell may have any of two electrical charge values, respectively representing the logic values 0 and 1. The storage ability of each transistor used as a memory cell in an MLC flash memory may be fully utilized, where the transistor may be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

Compared with the SLC flash memory, the lower cost and larger capacity of the MLC flash memory means it is more likely to be applied in memory devices. The MLC flash memory does have instability issues, however. To ensure that access control of the flash memory in the memory device meets related specifications, a controller of the flash memory is usually configured to have management mechanisms to properly manage the access of data.

Related art memory devices with the above management mechanisms still have some disadvantages. For example, as the triple level cell (TLC) flash memories have been applied to the memory devices, there are some problems such as an increased bit error rate, etc. Although a traditional sensing scheme regarding reading data from the TLC flash memories has been proposed to try solving the problems, it does not work for the memory devices equipped with the quadruple level cell (QLC) flash memories. More particularly, the traditional sensing scheme is not good for high-level per memory cell in the QLC flash memories. Thus, a novel method and associated architecture are needed for enhancing overall performance without introducing any side effect or in a way that is less likely to introduce a side effect.

SUMMARY OF THE INVENTION

It is an objective of the present invention to provide a method for performing access management of a memory device, which can efficiently obtain enough information for the decoding operations even if in a high density storage arrangement, to solve the above-mentioned problems.

According to one embodiment of the present invention, a flash memory controller is disclosed, wherein the flash memory controller is coupled to a flash memory module, the flash memory module comprises at least one flash memory chip, each flash memory chip comprises a plurality of blocks, each block comprises a plurality of pages, and the flash memory controller comprising a memory, a microprocessor and a control logic. The memory is configured to store a program code. The microprocessor is configured to execute the program code to access the flash memory module via a control logic. In the operations of the flash memory controller, after the microprocessor sends a read command to the flash memory module to ask for data on at least one memory unit, the control logic analyzes state information of a plurality of memory cells of the memory unit based on information from the flash memory module to determine a decoding method adopted by a decoder within the control logic.

According to another embodiment of the present invention, a method for accessing a flash memory module is provided, wherein the flash memory module comprises at least one flash memory chip, each flash memory chip comprises a plurality of blocks, each block comprises a plurality of pages, and the method comprises: sending a read command to the flash memory module to ask for data on at least one memory unit; and analyzing state information of a plurality of memory cells of the memory unit based on information obtained from the flash memory module to determine a decoding method adopted by a decoder.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
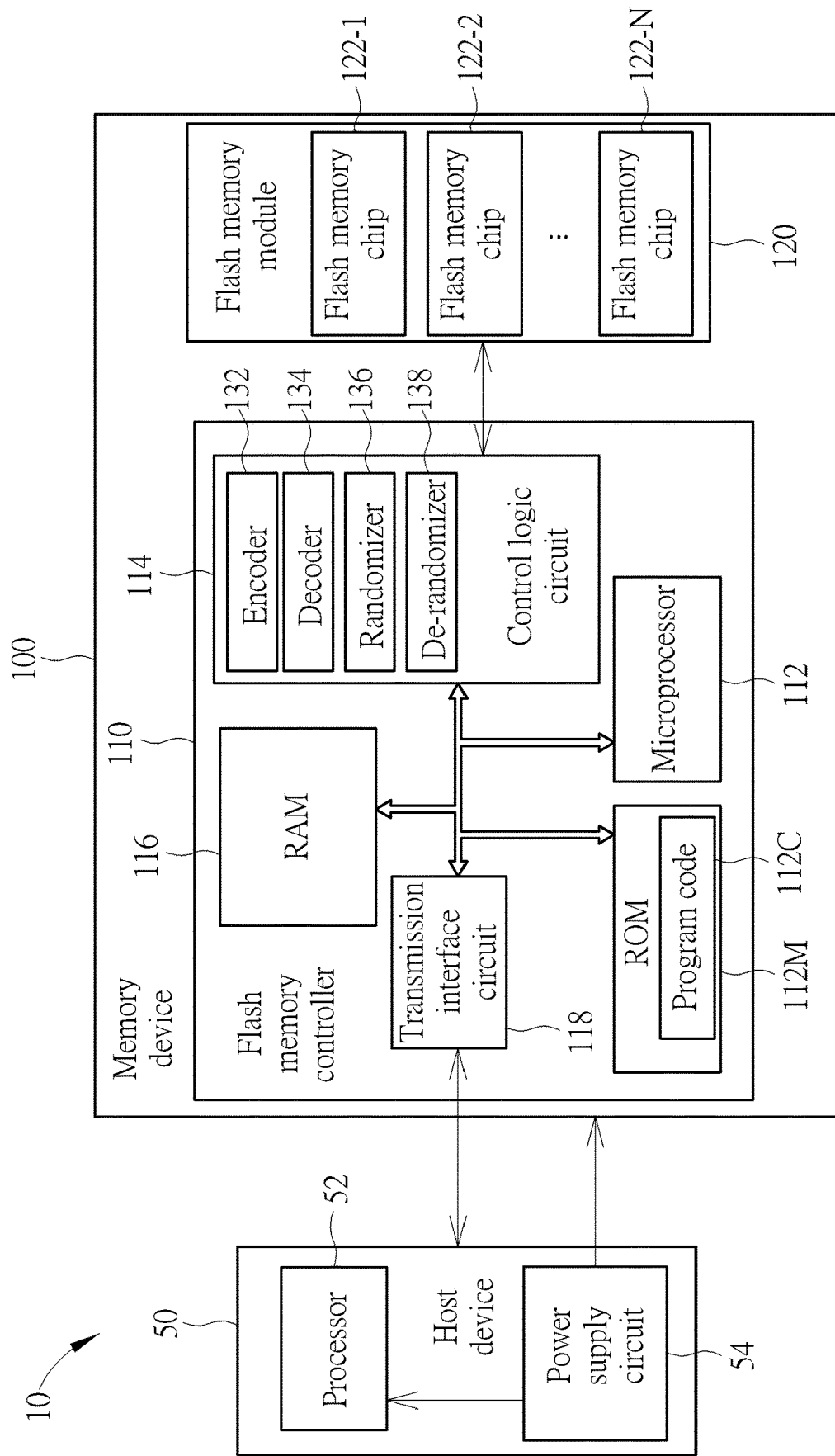
FIG. 1 is a diagram of an electronic device according to an embodiment of the present invention.

FIG. 1 is a diagram of an electronic device 10 according to an embodiment of the present invention, where the electronic device 10 may comprise a host device 50 and a memory device 100. The host device 50 may comprise at least one processor (e.g. one or more processors) which may be collectively referred to as the processor 52, and may further comprise a power supply circuit 54 coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. Examples of the host device 50 may include, but are not limited to: a multifunctional mobile phone, a wearable device, a tablet computer, and a personal computer such as a desktop computer and a laptop computer. Examples of the memory device 100 may include, but are not limited to: a solid state drive (SSD), and various types of embedded memory devices such as that conforming to Peripheral Component Interconnect Express (PCIe) specification, etc. According to this embodiment, the memory device 100 may comprise a flash memory controller 110, and may further comprise a flash memory module 120, where the flash controller 110 is arranged to control operations of the memory device 100 and access the flash memory module 120, and the flash memory module 120 is arranged to store information. The flash memory module 120 may comprise at least one flash memory chip such as a plurality of flash memory chips 122-1, 122-2, . . . , and 122-N, where "N" may represent a positive integer that is greater than one.

As shown in FIG. 1, the flash memory controller 110 may comprise a processing circuit such as a microprocessor 112, a storage unit such as a read-only memory (ROM) 112M, a control logic circuit 114, a RAM 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the ROM 112M of this embodiment is arranged to store a program code 112C, and the microprocessor 112 is arranged to execute the program code 112C to control the access of the flash memory 120. Note that, in some examples, the program code 112C may be stored in the RAM 116 or any type of memory. Further, the control logic circuit 114 may be arranged to control the flash memory 120, and may comprise an encoder 132, a decoder 134, a randomizer 136, a de-randomizer 138 and other circuits. The transmission interface circuit 118 may conform to a specific communications specification (e.g. Serial Advanced Technology Attachment (Serial ATA, or SATA) specification, Peripheral Component Interconnect (PCI) specification, Peripheral Component Interconnect Express (PCIe) specification, UFS specification, etc.), and may perform communications according to the specific communications specification, for example, perform communications with the host device 50 for the memory device 100, where the host device 50 may comprise the corresponding transmission interface circuit conforming to the specific communications specification, for performing communications with the memory device 100 for the host device 50.

In this embodiment, the host device 50 may transmit host commands and corresponding logical addresses to the memory controller 110 to access the memory device 100. The memory controller 110 receives the host commands and the logical addresses, and translates the host commands into memory operating commands (which may be simply referred to as operating commands), and further controls the flash memory module 120 with the operating commands to perform reading, writing/programming, etc. on memory units (e.g. pages) having physical addresses within the flash memory module 120, where the physical addresses correspond to the logical addresses. When the flash memory controller 110 perform an erase operation on any flash memory chip 122-$n$ of the plurality of NV memory elements 122-1, 122-2, . . . , and 122-N (in which "n" may represent any integer in the interval [1, N]), at least one block of multiple blocks of the flash memory chip 122-$n$ may be erased, where each block of the blocks may comprise multiple pages (e.g. data pages), and an access operation (e.g. reading or writing) may be performed on one or more pages.

Figure 2:
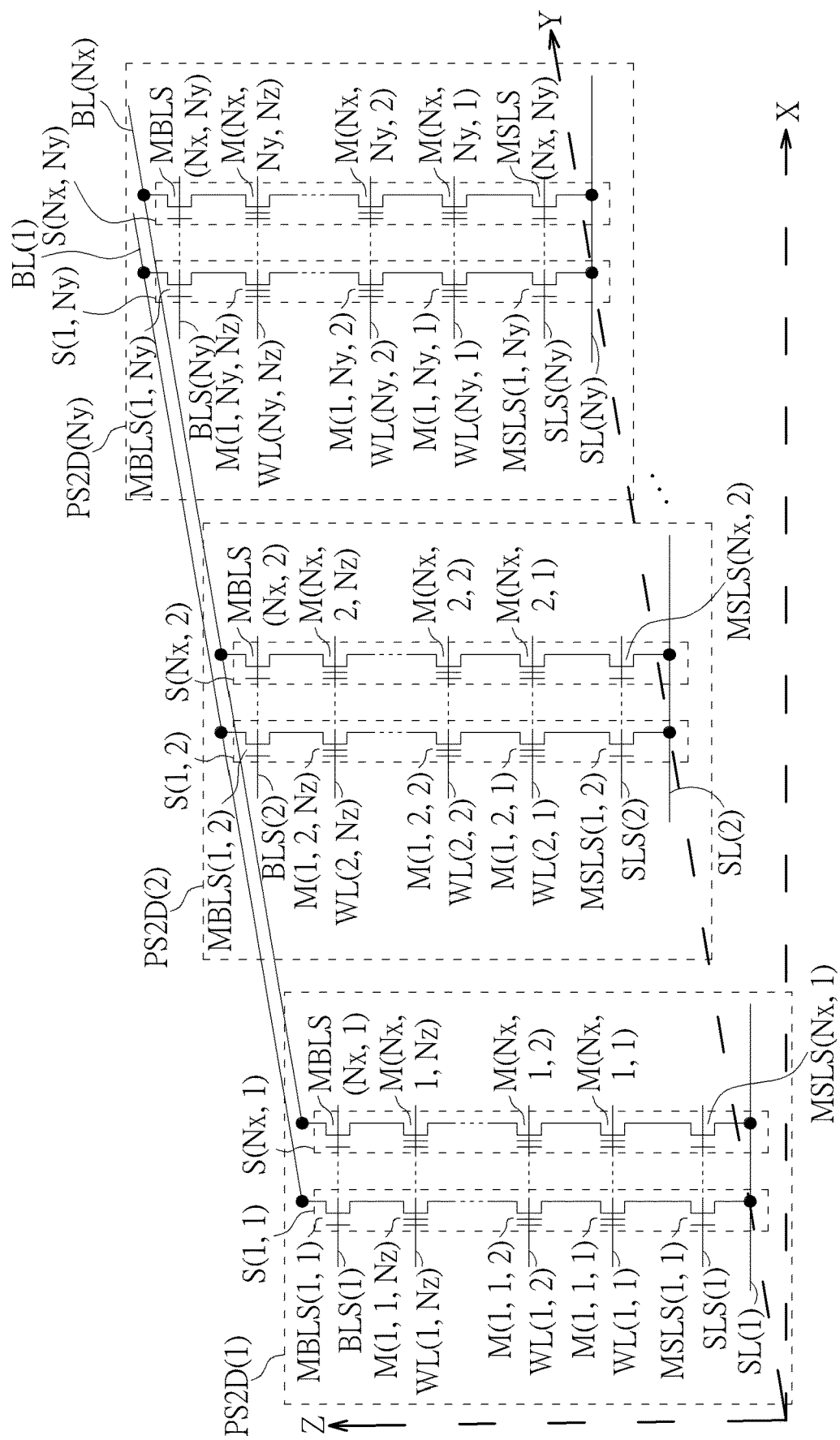
FIG. 2 is a diagram of a three-dimensional (3D) NAND flash memory according to an embodiment of the present invention.

FIG. 2 is a diagram of a three-dimensional (3D) NAND flash memory according to an embodiment of the present invention. For example, any memory element within the aforementioned at least one of the flash memory chips 122-1, 122-2, . . . , and 122-N, may be implemented based on the 3D NAND flash memory shown in FIG. 2, but the present invention is not limited thereto.

According to this embodiment, the 3D NAND flash memory may comprise a plurality of memory cells arranged in a 3D structure, such as (Nx*Ny*Nz) memory cells {{M(1, 1, 1), . . . , M(Nx, 1, 1)}, {M(1, 2, 1), . . . , M(Nx, 2, 1)}, . . . , {M(1, Ny, 1), . . . , M(Nx, Ny, 1)}}, {{M(1, 1, 2), . . . , M(Nx, 1, 2)}, {M(1, 2, 2), . . . , M(Nx, 2, 2)}, . . . , {M(1, Ny, 2), . . . , M(Nx, Ny, 2)}}, . . . , and {{M(1, 1, Nz), . . . , M(Nx, 1, Nz)}, {M(1, 2, Nz), . . . , M(Nx, 2, Nz)}, . . . , {M(1, Ny, Nz), . . . , M(Nx, Ny, Nz)}} that are respectively arranged in Nz layers perpendicular to the Z-axis and aligned in three directions respectively corresponding to the X-axis, the Y-axis, and the Z-axis, and may further comprise a plurality of selector circuits for selection control, such as (Nx*Ny) upper selector circuits {MBLS(1, 1), . . . , MBLS(Nx, 1)}, {MBLS(1, 2), . . . , MBLS(Nx, 2)}, . . . , and {MBLS(1, Ny), . . . , MBLS(Nx, Ny)} that are arranged in an upper layer above the Nz layers and (Nx*Ny) lower selector circuits {MSLS(1, 1), ..., MSLS(Nx, 1)}, {MSLS(1, 2), ..., MSLS(Nx, 2)}, ..., and {MSLS(1, Ny), ..., MSLS(Nx, Ny)} that are arranged in a lower layer below the Nz layers. In addition, the 3D NAND flash memory may comprise a plurality of bit lines and a plurality of word lines for access control, such as Nx bit lines BL(1), ..., and BL(Nx) that are arranged in a top layer above the upper layer and (Ny*Nz) word lines {WL(1, 1), WL(2, 1), ..., WL(Ny, 1)}, {WL(1, 2), WL(2, 2), ..., WL(Ny, 2)}, ..., and {WL(1, Nz), WL(2, Nz), ..., WL(Ny, Nz)} that are respectively arranged in the Nz layers. Additionally, the 3D NAND flash memory may comprise a plurality of selection lines for selection control, such as Ny upper selection lines BLS(1), BLS(2), ..., and BLS(Ny) that are arranged in the upper layer and Ny lower selection lines SLS(1), SLS(2), ..., and SLS(Ny) that are arranged in the lower layer, and may further comprise a plurality of source lines for providing reference levels, such as Ny source lines SL(1), SL(2), ..., and SL(Ny) that are arranged in a bottom layer below the lower layer.

As shown in FIG. 2, the 3D NAND flash memory may be divided into Ny circuit modules PS2D(1), PS2D(2), ..., and PS2D(Ny) distributed along the Y-axis. For better comprehension, the circuit modules PS2D(1), PS2D(2), ..., and PS2D(Ny) may have some electrical characteristics similar to that of a planar NAND flash memory having memory cells arranged in a single layer, and therefore may be regarded as pseudo-2D circuit modules, respectively, but the present invention is not limited thereto. In addition, any circuit module PS2D(ny) of the circuit modules PS2D(1), PS2D(2), ..., and PS2D(Ny) may comprise Nx secondary circuit modules S(1, ny), ..., and S(Nx, ny), where "ny" may represent any integer in the interval [1, Ny]. For example, the circuit module PS2D(1) may comprise Nx secondary circuit modules S(1, 1), ..., and S(Nx, 1), the circuit module PS2D(2) may comprise Nx secondary circuit modules S(1, 2), ..., and S(Nx, 2), ..., and the circuit module PS2D(Ny) may comprise Nx secondary circuit modules S(1, Ny), ..., and S(Nx, Ny). In the circuit module PS2D(ny), any secondary circuit module S(nx, ny) of the secondary circuit modules S(1, ny), ..., and S(Nx, ny) may comprise Nz memory cells M(nx, ny, 1), M(nx, ny, 2), ..., and M(nx, ny, Nz), and may comprise a set of selector circuits corresponding to the memory cells M(nx, ny, 1), M(nx, ny, 2), ..., and M(nx, ny, Nz), such as the upper selector circuit MBLS(nx, ny) and the lower selector circuit MSLS(nx, ny), where "nx" may represent any integer in the interval [1, Nx]. The upper selector circuit MBLS(nx, ny) and the lower selector circuit MSLS(nx, ny) and the memory cells M(nx, ny, 1), M(nx, ny, 2), ..., and M(nx, ny, Nz) may be implemented with transistors. For example, the upper selector circuit MBLS(nx, ny) and the lower selector circuit MSLS(nx, ny) may be implemented with ordinary transistors without any floating gate, and any memory cell M(nx, ny, nz) of the memory cells M(nx, ny, 1), M(nx, ny, 2), ..., and M(nx, ny, Nz) may be implemented with a floating gate transistor, where "nz" may represent any integer in the interval [1, Nz], but the present invention is not limited thereto. Further, the upper selector circuits MBLS(1, ny), ..., and MBLS(Nx, ny) in the circuit module PS2D(ny) may perform selection according to the selection signal on the corresponding selection line BLS(ny), and the lower selector circuits MSLS(1, ny), ..., and MSLS(Nx, ny) in the circuit module PS2D(ny) may perform selection according to the selection signal on the corresponding selection line SLS(ny).

Figure 3:
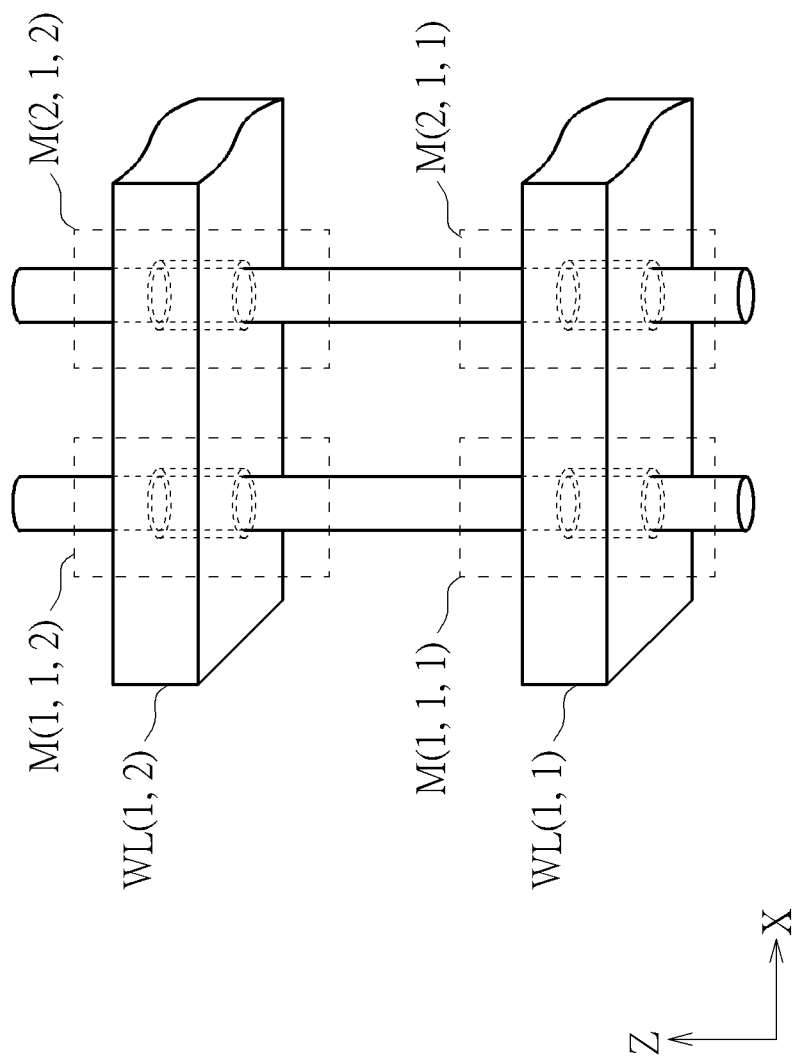
FIG. 3 illustrates some partial structures of the 3D NAND flash memory shown in FIG. 2 according to an embodiment of the present invention.

FIG. 3 illustrates some partial structures of the 3D NAND flash memory shown in FIG. 2 according to an embodiment of the present invention. The 3D NAND flash memory may be designed to have a plurality of rod-shaped partial structures such as that shown in FIG. 3, and the plurality of rod-shaped partial structures may be arranged to pass through the secondary circuit modules {S(1, 1), ..., S(Nx, 1)}, {S(1, 2), ..., S(Nx, 2)}, ..., and {S(1, Ny), ..., S(Nx, Ny)}, respectively. For better comprehension, the plurality of rod-shaped partial structures may be regarded as the channels of the associated transistors of the secondary circuit modules {S(1, 1), ..., S(Nx, 1)}, {S(1, 2), ..., S(Nx, 2)}, ..., and {S(1, Ny), ..., S(Nx, Ny)} within the architecture shown in FIG. 2, respectively, such as the channels of the ordinary transistors for implementing the upper selector circuit MBLS(nx, ny) and the lower selector circuit MSLS(nx, ny) and the channel of the floating gate transistor for implementing the memory cell M(nx, ny, nz). According to some embodiments, the number of the plurality of rod-shaped partial structures may be equal to the total amount (Nx*Ny) of the secondary circuit modules {S(1, 1), ..., S(Nx, 1)}, {S(1, 2), ..., S(Nx, 2)}, ..., and {S(1, Ny), ..., S(Nx, Ny)}, but the present invention is not limited thereto. For example, the arrangement of the plurality of memory cells may be changed, and the number of the plurality of rod-shaped partial structures may be changed correspondingly.

In addition, the 3D NAND flash memory may be designed to have a plurality of pipe-shaped partial structures, and the plurality of pipe-shaped partial structures may be arranged to encircle the plurality of rod-shaped partial structures to form the respective components of the secondary circuit modules {S(1, 1), ..., S(Nx, 1)}, {S(1, 2), ..., S(Nx, 2)}, ..., and {S(1, Ny), ..., S(Nx, Ny)}, and more particularly, to form the respective control gates and the respective floating gates of the plurality of memory cells and the respective gates of the plurality of selector circuits in the architecture shown in FIG. 2. The memory cells {{M(1, 1, 1), M(2, 1, 1), ... }, {M(1, 1, 2), M(2, 1, 2), ... }, ... } and the word lines {WL(1, 1), WL(1, 2), ... } are illustrated in FIG. 3, and the pipe-shaped partial structures shown in FIG. 3 may indicate that there are some additional partial structures surrounding each of the plurality of rod-shaped partial structures, where further details regarding the additional partial structures will be described in the following embodiments.

Figure 4:
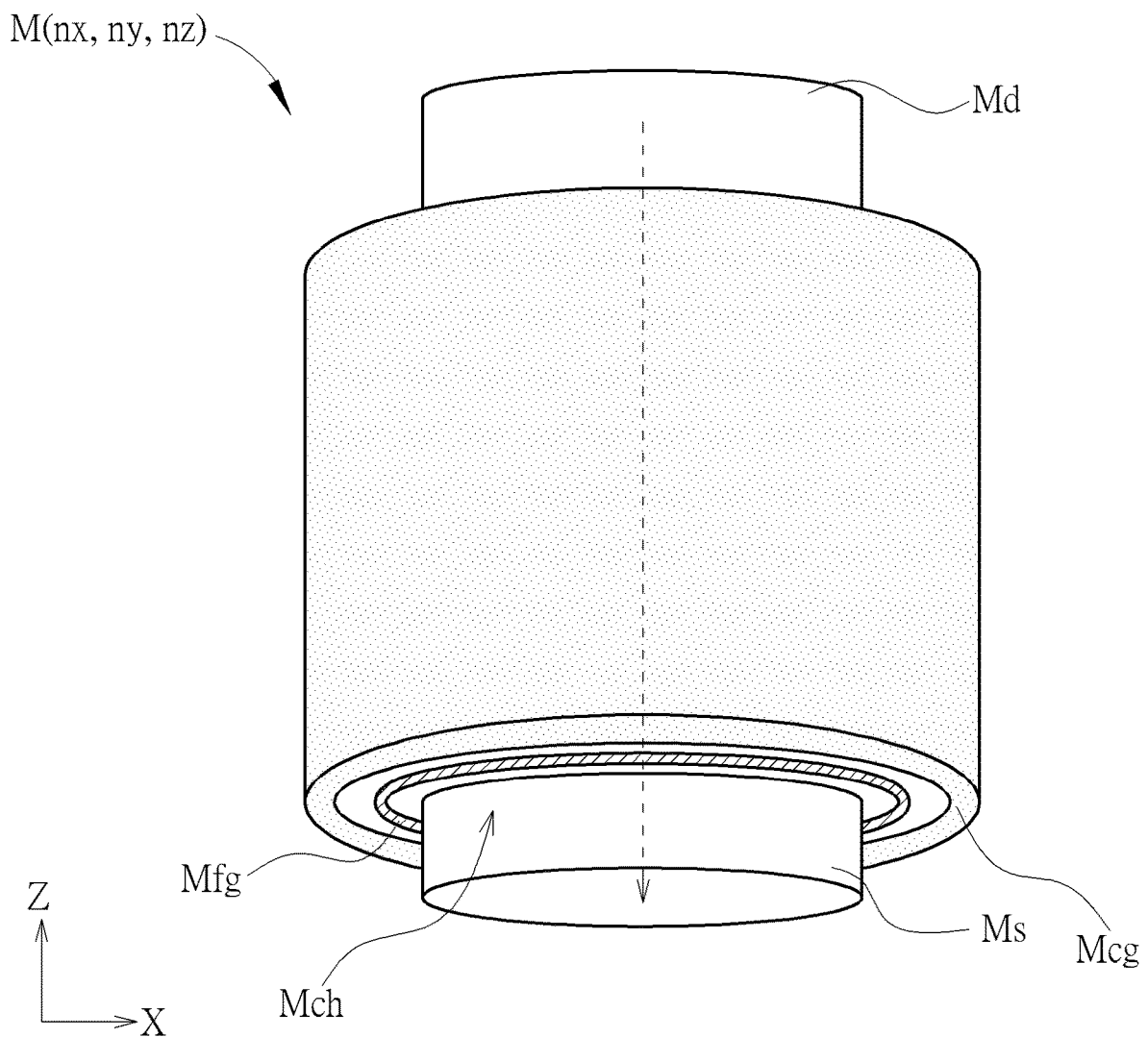
FIG. 4 illustrates some implementation details of one of the memory cells of the 3D NAND flash memory shown in FIG. 2 according to an embodiment of the present invention.

FIG. 4 illustrates some implementation details of one of the memory cells of the 3D NAND flash memory shown in FIG. 2 according to an embodiment of the present invention. As shown in FIG. 4, the memory cell M(nx, ny, nz) may comprise a portion of one of the plurality of rod-shaped partial structures, such as a rod segment within the rod-shaped partial structure corresponding to the secondary circuit module S(nx, ny), and may further comprise some pipe-shaped partial structures having the same symmetry axis. For example, the upper side Md and the lower side Ms of the rod segment may be utilized as the drain and the source of the floating gate transistor for implementing the memory cell M(nx, ny, nz), and a first pipe-shaped partial structure Mfg and a second pipe-shaped partial structure Mcg within these pipe-shaped partial structures may be utilized as the floating gate and the control gate of this floating gate transistor. The other pipe-shaped partial structures within these pipe-shaped partial structures, such as the pipe-shaped partial structure between the rod segment and the first pipe-shaped partial structure Mfg and the pipe-shaped partial structure between the first pipe-shaped partial structure Mfg and the second pipe-shaped partial structure Mcg, may be implemented with one or more insulation materials.

According to some embodiments, any selector circuit of the plurality of selector circuits in the architecture shown in FIG. 2 may be implemented by altering the architecture shown in FIG. 4. For example, the upper side Md and the lower side Ms of the rod segment may be utilized as the drain and the source of the ordinary transistor for implementing this selector circuit, and the second pipe-shaped partial structure Mcg within these pipe-shaped partial structures may be utilized as the gate of the ordinary transistor, where the first pipe-shaped partial structure Mfg should be removed from the one or more insulation materials. As a result, there may be only one pipe-shaped partial structure between the rod segment and the second pipe-shaped partial structure Mcg, but the present invention is not limited thereto.

In the flash memory module 120, when the block of any one of the flash memory chips 122-1-122-N serves as a SLC block, each of the physical pages within the block correspond to one logical page, that is each of the memory cells of the page is configured to store only one bit, wherein one physical page may comprise all of the transistors controlled by a word line (e.g. the memory cells M(1, 1, Nz)–M(Nx, 1, Nz) corresponding to the word line WL(1, Nz) form a physical page). When the block of any one of the flash memory chips 122-1-122-N serves as an MLC block, each of the physical pages within the block correspond to two logical pages, that is each of the memory cells of the page is configured to store two bits. When the block of any one of the flash memory chips 122-1-122-N serves as a TLC block, each of the physical pages within the block correspond to three logical pages, that is each of the memory cells of the page is configured to store three bits. When the block of any one of the flash memory chips 122-1-122-N serves as a QLC block, each of the physical pages within the block correspond to four logical pages, that is each of the memory cells of the page is configured to store four bits.

Figure 5:
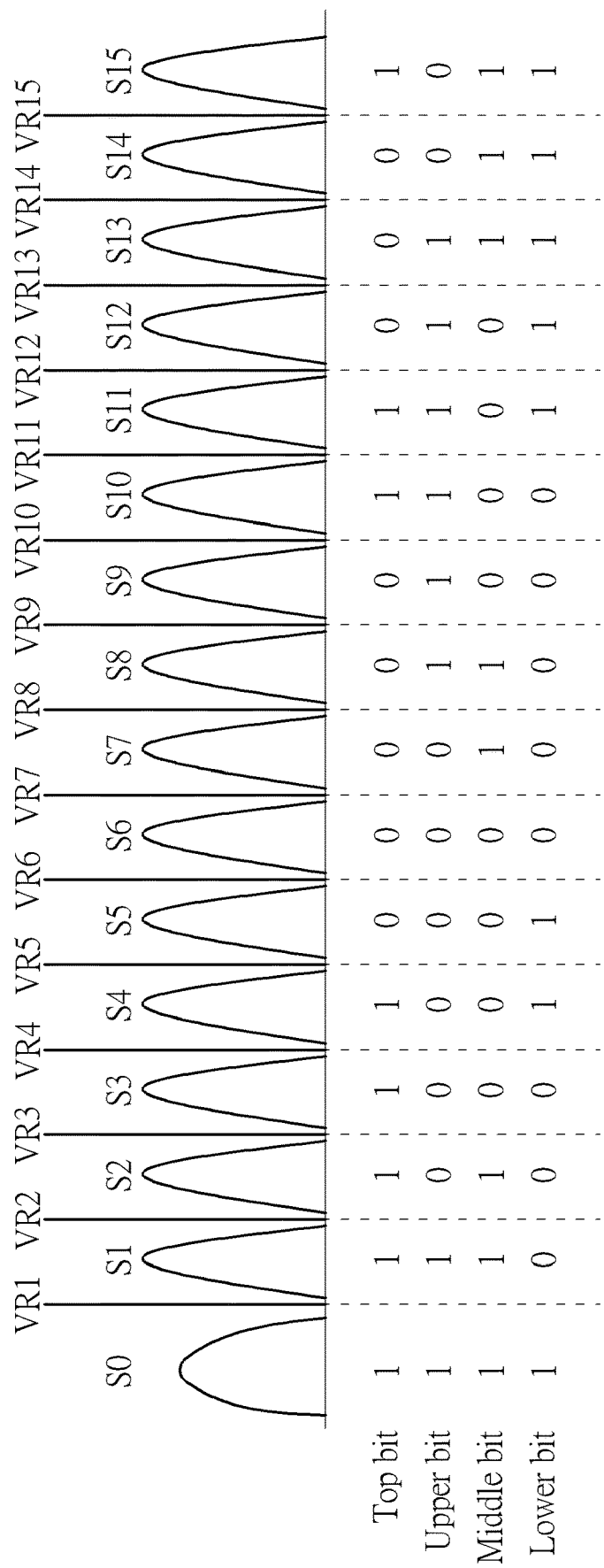
FIG. 5 is a diagram illustrating a plurality of states (program states) of a memory cell of the QLC block according to one embodiment of the present invention.

FIG. 5 is a diagram illustrating a plurality of states (program states) of a memory cell of the QLC block according to one embodiment of the present invention. As shown in FIG. 5, each memory cell can have sixteen states, and each state represents different combinations of four bits that are named as a top bit, an upper bit, a middle bit and a lower bit. In the embodiment shown in FIG. 5, when the memory cell is programmed to have the state S0, the top bit, the upper bit, the middle bit and the lower bit stored in the memory cell are (1, 1, 1, 1); when the memory cell is programmed to have the state S1, the top bit, the upper bit, the middle bit and the lower bit stored in the memory cell are (1, 1, 1, 0); when the memory cell is programmed to have the state S2, the top bit, the upper bit, the middle bit and the lower bit stored in the memory cell are (1, 0, 1, 0); when the memory cell is programmed to have the state S3, the top bit, the upper bit, the middle bit and the lower bit stored in the memory cell are (1, 0, 0, 0); when the memory cell is programmed to have the state S4, the top bit, the upper bit, the middle bit and the lower bit stored in the memory cell are (1, 0, 0, 1); when the memory cell is programmed to have the state S5, the top bit, the upper bit, the middle bit and the lower bit stored in the memory cell are (0, 0, 0, 1); when the memory cell is programmed to have the state S6, the top bit, the upper bit, the middle bit and the lower bit stored in the memory cell are (0, 0, 0, 0); when the memory cell is programmed to have the state S7, the top bit, the upper bit, the middle bit and the lower bit stored in the memory cell are (0, 0, 1, 0); when the memory cell is programmed to have the state S8, the top bit, the upper bit, the middle bit and the lower bit stored in the memory cell are (0, 1, 1, 0); when the memory cell is programmed to have the state S9, the top bit, the upper bit, the middle bit and the lower bit stored in the memory cell are (0, 1, 0, 0); when the memory cell is programmed to have the state S10, the top bit, the upper bit, the middle bit and the lower bit stored in the memory cell are (1, 1, 0, 0); when the memory cell is programmed to have the state S11, the top bit, the upper bit, the middle bit and the lower bit stored in the memory cell are (1, 1, 0, 1); when the memory cell is programmed to have the state S12, the top bit, the upper bit, the middle bit and the lower bit stored in the memory cell are (0, 1, 0, 1); when the memory cell is programmed to have the state S13, the top bit, the upper bit, the middle bit and the lower bit stored in the memory cell are (0, 1, 1, 1); when the memory cell is programmed to have the state S14, the top bit, the upper bit, the middle bit and the lower bit stored in the memory cell are (0, 0, 1, 1); and when the memory cell is programmed to have the state S15, the top bit, the upper bit, the middle bit and the lower bit stored in the memory cell are (1, 0, 1, 1).

In the conventional art, when the top bit is required to be read by the flash memory controller 110, the flash memory controller 110 can control the flash memory module 120 to apply four read voltages VR5, VR10, VR12 and VR15 to read the memory cell. If the memory cell is conductive when the read voltage VR5 is applied, the top bit is determined to be "1"; if the memory cell is not conductive when the read voltage VR5 is applied, and the memory cell is conductive when the read voltage VR10 is applied, the top bit is determined to be "0"; if the memory cell is not conductive when the read voltage VR10 is applied, and the memory cell is conductive when the read voltage VR12 is applied, the top bit is determined to be "1"; if the memory cell is not conductive when the read voltage VR12 is applied, and the memory cell is conductive when the read voltage VR15 is applied, the top bit is determined to be "0"; and if the memory cell is not conductive when the read voltage VR15 is applied, the top bit is determined to be "1". When the upper bit is required to be read by the flash memory controller 110, the flash memory controller 110 can control the flash memory module 120 to apply three read voltages VR2, VR8 and VR14 to read the memory cell. If the memory cell is conductive when the read voltage VR2 is applied, the upper bit is determined to be "1"; if the memory cell is not conductive when the read voltage VR2 is applied, and the memory cell is conductive when the read voltage VR8 is applied, the upper bit is determined to be "0"; if the memory cell is not conductive when the read voltage VR8 is applied, and the memory cell is conductive when the read voltage VR14 is applied, the upper bit is determined to be "0"; and if the memory cell is not conductive when the read voltage VR14 is applied, the upper bit is determined to be "0". When the middle bit is required to be read by the flash memory controller 110, the flash memory controller 110 can control the flash memory module 120 to apply four read voltages VR3, VR7, VR9 and VR13 to read the memory cell. If the memory cell is conductive when the read voltage VR3 is applied, the middle bit is determined to be "1"; if the memory cell is not conductive when the read voltage VR3 is applied, and the memory cell is conductive when the read voltage VR7 is applied, the middle bit is determined to be "0"; if the memory cell is not conductive when the read voltage VR7 is applied, and the memory cell is conductive when the read voltage VR9 is applied, the middle bit is determined to be "1"; if the memory cell is not conductive when the read voltage VR9 is applied, and the memory cell is conductive when the read voltage VR13 is applied, the middle bit is determined to be "0"; and if the memory cell is not conductive when the read voltage VR13 is applied, the middle bit is determined to be "1". When the lower bit is required to be read by the flash memory controller 110, the flash memory controller 110 can control the flash memory module 120 to apply four read voltages VR1, VR4, VR6 and VR11 to read the memory cell. If the memory cell is conductive when the read voltage VR1 is applied, the lower bit is determined to be "1"; if the memory cell is not conductive when the read voltage VR1 is applied, and the memory cell is conductive when the read voltage VR4 is applied, the lower bit is determined to be "0"; if the memory cell is not conductive when the read voltage VR4 is applied, and the memory cell is conductive when the read voltage VR6 is applied, the lower bit is determined to be "1"; if the memory cell is not conductive when the read voltage VR6 is applied, and the memory cell is conductive when the read voltage VR11 is applied, the lower bit is determined to be "0"; and if the memory cell is not conductive when the read voltage VR11 is applied, the lower bit is determined to be "1".

It is noted that the gray code shown in FIG. 5 is for illustratively only, and it's not a limitation of the present invention. Any suitable gray code can be used in the memory device 100, and the read voltages for determining the top bit, the upper bit, the middle bit and the lower bit may be changed accordingly.

The bit read from the memory cell by using part of the read voltages VR1-VR15 can be regarded as a sign bit, and the sign bits obtained from a plurality of memory cells (e.g. 4K memory cells) are processed by the de-randomizer 138 and performed error correction operations by the decoder 134 to generate the encoded data. However, because the state intervals of the memory cell within the QLC block are small, so the states may have serious variations due to the read disturbance, program disturbance or data retention issue occurred in the flash memory, and the error correction operations may be failed. To solve this problem, the conventional art further applies additional read voltages to read the memory cell to obtain a plurality of soft bits to increase the success rate of the error correction operations. For example, if the decoder 134 fails to decode the sign bits obtained from the memory cells, the flash memory controller 110 may control the flash memory module 120 to use additional read voltages to read the memory cells again to obtain a first group of soft bits, and the decoder 134 uses a low-density parity-check code (LDPC) method to decode the sign bits with the first group of soft bits. For example, if the flash memory controller 110 intends to read the top page (i.e. the top bits of the memory cells) of the block, the flash memory controller 110 may control the flash memory module 120 to use the additional read voltages (VR5−Δ), (VR10−Δ), (VR12−Δ) and (VR15−Δ) to obtain the first group of soft bits. If the decoder 134 still fails, the flash memory controller 110 may control the flash memory module 120 to use additional read voltages (VR5+Δ), (VR10+Δ), (VR12+Δ) and (VR15+Δ) to read the memory cells again to obtain a second group of soft bits, and the decoder 134 uses the LDPC method to decode the sign bits with the first group of soft bits and the first group of soft bits, . . . , and so on.

In light of above, if the flash memory controller 110 needs to read data from the QLC block within the flash memory module 120, the flash memory controller 110 may read the memory cells and decode the data many times to obtain the soft bits to successfully decode the data, each time the flash memory controller 110 reading the memory cells needs to transmit a read command to the flash memory module 120, and the flash memory module 120 needs a read busy time to read the sign bits or soft bits. Therefore, the conventional read mechanism for the high density storage such as QLC blocks with the 3D NAND flash memory is inefficient.

To solve the above-mentioned problem, the embodiments of the present invention provide a read mechanism and decoding method to access the flash memory module 120 efficiently.

Figure 6:
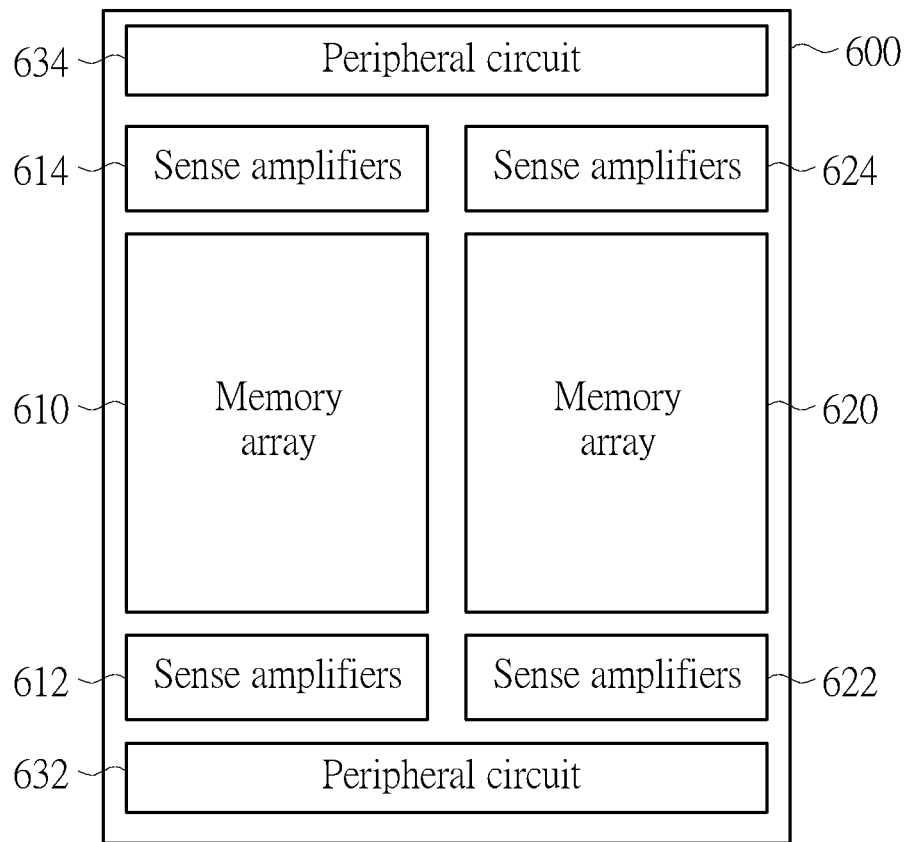
FIG. 6 is a diagram illustrating a flash memory chip according to one embodiment of the present invention.

FIG. 6 is a diagram illustrating a flash memory chip 600 according to one embodiment of the present invention, wherein the flash memory chip 600 can be any one of the flash memory chips 122-1-122-N shown in FIG. 1. As shown in FIG. 6, the flash memory chip 600 comprises two memory arrays 610 and 620, sense amplifiers 612, 614, 622 and 624, and peripheral circuits 632 and 634, wherein the memory arrays 610 and 620 comprises the memory cells as shown in FIG. 2, the sense amplifiers 612, 614, 622 and 624 are configured to read the data from the memory arrays 610 and 620, and the peripheral circuits 632 and 634 comprise pads, associated control circuit and other interface circuits.

Figure 7:
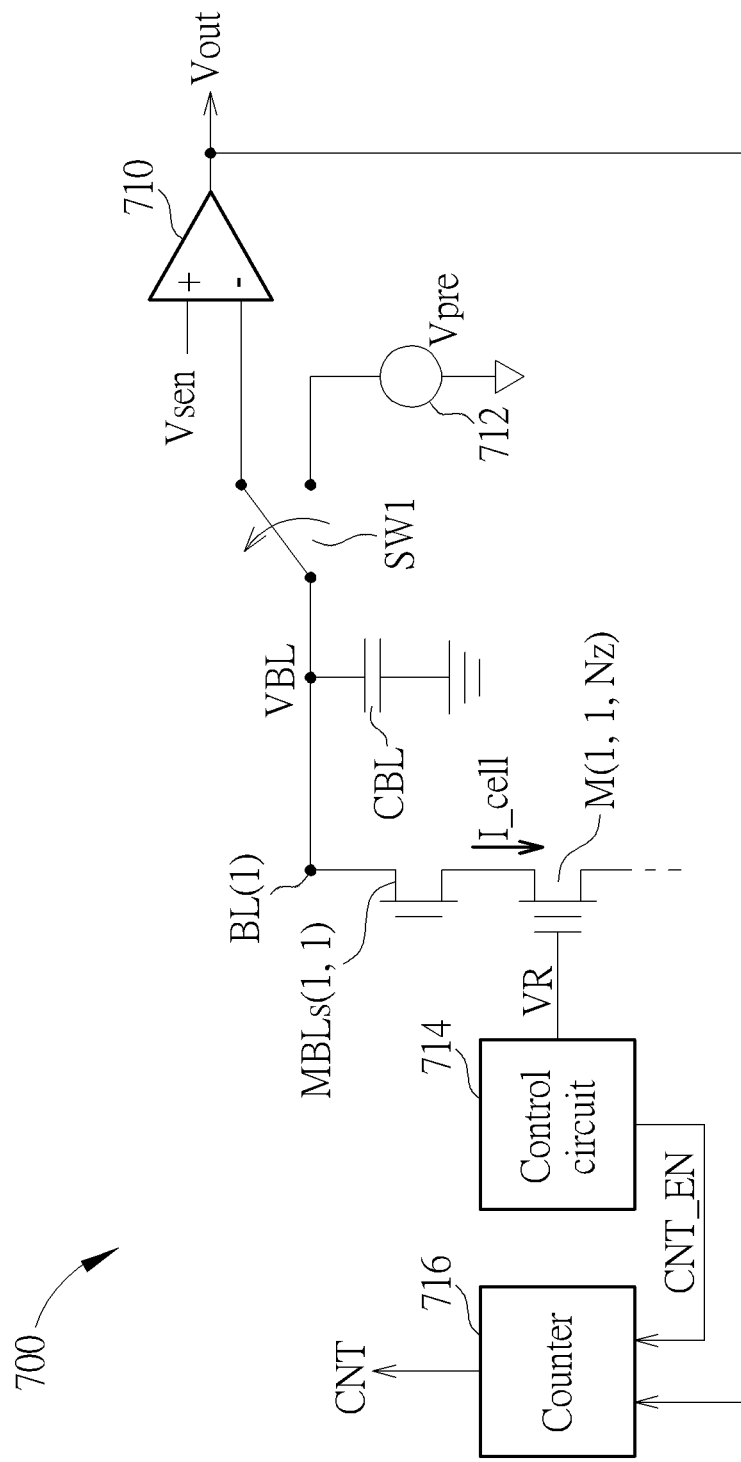
FIG. 7 is a diagram illustrating a sense amplifier according to a first embodiment of the present invention.

FIG. 7 is a diagram illustrating a sense amplifier 700 according to a first embodiment of the present invention. In FIG. 7, the sense amplifier 700 comprises an operational amplifier 710, a voltage source 712, a control circuit 714, a counter 716 and a switch SW1. In this embodiment, the sense amplifier 700 is arranged to read the memory cell M(1, 1, Nz) corresponding to the bit line BL(1) and the word line WL(1, Nz) shown in FIG. 1. When the memory cell M(1, 1, Nz) is to be read, the control circuit 714 is configured to generate read voltage VR to the memory cell M(1, 1, Nz) shown in FIG. 1, the upper selector circuit MBLS(1, 1) and the other memory cells M(1, 1, 1)–M(1, 1, (Nz−1)) are controlled to be conductive.

Figure 8:
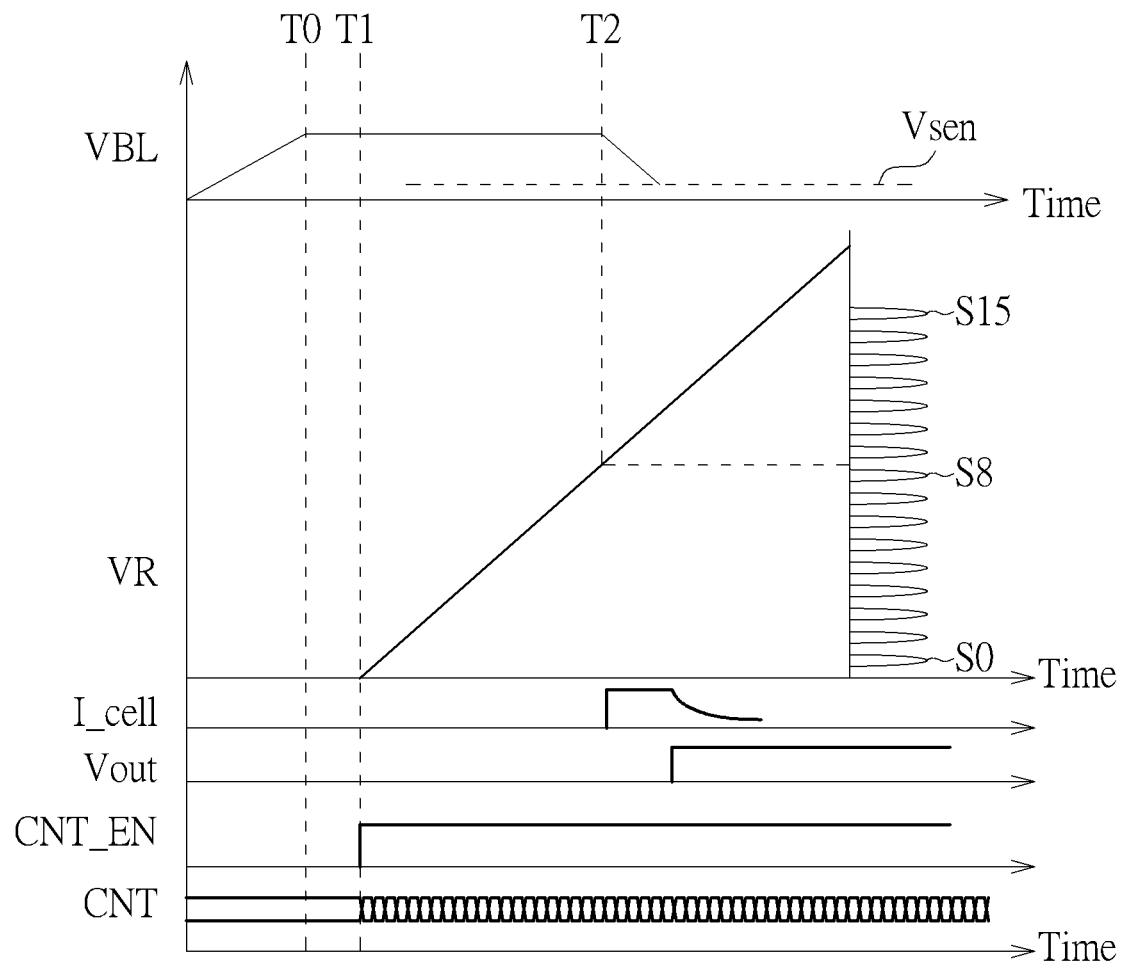
FIG. 8 is a timing diagram of some signals of the sense amplifier shown in FIG. 7 according to one embodiment of the present invention.

Refer to FIG. 7 and FIG. 8 together, FIG. 8 is a timing diagram of some signals of the sense amplifier 700 according to one embodiment of the present invention. In the operations of the sense amplifier 700, initially the read voltage VR is equal to zero (i.e. the memory cell M(1, 1, Nz) is disabled), the switch SW1 is controlled to connect the bit line BL(1) to the voltage source 712, and the voltage source 712 starts to charge the parasitic capacitor CBL to make the voltage VBL at one terminal of the parasitic capacitor CBL be equal to a voltage Vpre provided by the voltage source 712 at the time T0. Then, at the time T1, the switch SW1 is controlled to connect the bit line BL(1) to the negative terminal of the operational amplifier 710, the control circuit 714 starts to generate a ramp signal serving as the read voltage VR to the word line WL(1, Nz) to control the memory cell M(1, 1, Nz), and the counter 716 starts to work and provides an increasing count value CNT when the output signal Vout goes high. For example, assuming that the memory cell M(1, 1, Nz) stores the data corresponding to the state S8 whose threshold voltage is about 3V, when the read voltage VR starts to go high from 0V to 3V, because the read voltage VR is not high enough to enable the memory cell M(1, 1, Nz), the voltage VBL keeps at the voltage Vpre, and the output signal Vout generated by the operational amplifier 710 is equal to "0" because the voltage VBL/Vpre is greater than a reference voltage Vsen at the positive terminal of the operational amplifier 710. When the read voltage VR is greater than the threshold voltage of the memory cell M(1, 1, Nz) at time T2, the memory cell M(1, 1, Nz) is enabled to generate a current I_cell to discharge the parasitic capacitor CBL, and the voltage VBL is decreased. When the voltage VBL is decreased to be lower than the reference voltage Vsen, the output signal Vout becomes "1" to trigger the counter 716 to output the current count value CNT. In the embodiment shown in FIG. 8, if the memory cell M(1, 1, Nz) stores the data corresponding to the state S8, the count value CNT is about "28".

In the embodiments shown in FIG. 7 and FIG. 8, because the slope of the read voltage VR, the discharging time and the circuit delay is known, the count value CNT outputted by the counter 716 can exactly represent the threshold voltage of the memory cell M(1, 1, Nz). In addition, if the counter 716 has a higher resolution such as a 8-bit counter (i.e. a clock used by the counter 716 has a higher frequency), the count value CNT can represent the sign bit and soft bits of the memory cell M(1, 1, Nz). Therefore, compared with the conventional art using many read operations to obtain the sign bits and the soft bits, the embodiment of the present invention can get the sign bits and the soft bits in a single read command, and the read efficiency is greatly improved. Moreover, because the count value CNT outputted by the counter 716 can represent the threshold voltage of the memory cell M(1, 1, Nz), that is the state of the memory cell M(1, 1, Nz) can be obtained, therefore, the information carried by the count value CNT is much more than the sign bit obtained by the conventional art (i.e. the conventional sign bit cannot exactly indicate which state the memory cell M(1, 1, Nz) has). In detail, if the top bit of the memory cell M(1, 1, Nz) is to be read, the conventional art uses the read voltages VR5, VR10, VR12 and VR15 to read the memory cell M(1, 1, Nz), and the flash memory module only sends the top bit to the flash memory controller. For example, if the conventional flash memory module outputs the top bit "1" (i.e., sign bit) to the flash memory controller, the flash memory controller merely knows that the memory cell M(1, 1, Nz) has one of the states S0-S4, S10-S11 and S15, but the flash memory controller cannot exactly know which one the memory cell M(1, 1, Nz) has.

It is noted that although FIG. 8 shows using the ramp signal to serve as the read voltage VR, it's not a limitation of the present invention. In other embodiments, the control circuit 714 can apply the read voltage VR with different voltage levels to the memory cell M(1, 1, Nz) (i.e. the read voltage VR with different voltage levels can be regarded as a plurality of read voltages), and each voltage level of the read voltage VR corresponds a count value CNT, the read voltage VR may have any other suitable designs. In one embodiment, the quantity of the voltage levels of the read voltage VR (or quantity of the read voltages) is equal to or greater than quantity of the states of the memory cell M(1, 1, Nz).

Figure 9:
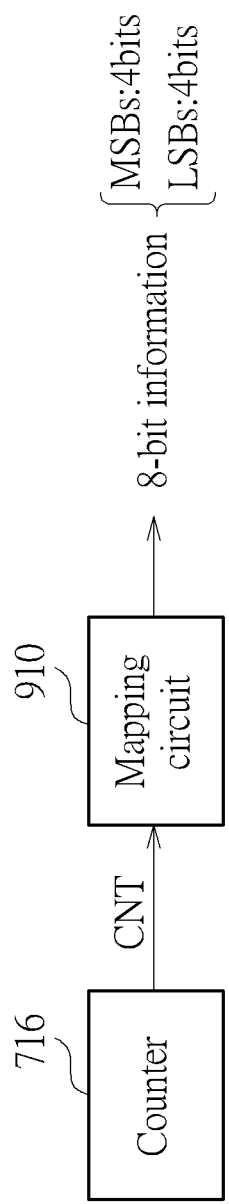
FIG. 9 is a diagram illustrating the counter and the mapping circuit according to one embodiment of the present invention.
Figure 10:
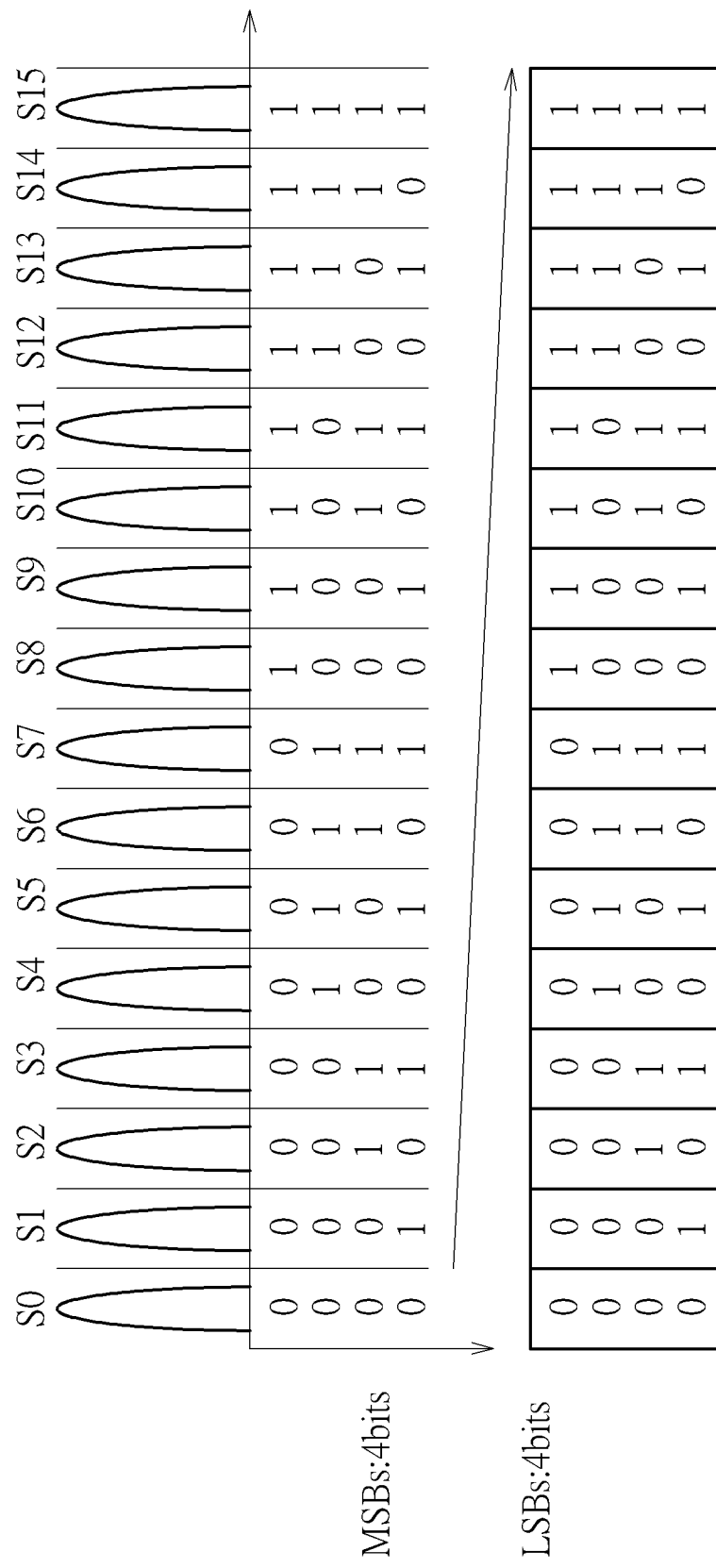
FIG. 10 is a diagram illustrating the states S0-S15 and the corresponding MSBs and LSBs according to one embodiment of the present invention.

In one embodiment, the sense amplifier 700 further comprises a mapping circuit 910 shown in FIG. 9. The mapping circuit 910 is configured to convert the count value into 8-bit information indicating the threshold voltage or the states of the memory cell M(1, 1, Nz), where the four bits are most significant bits (MSBs), and the other four bits are least significant bits (LSBs). For example, the count value "1" maps to the 8-bit information (0, 0, 0, 0, 0, 0, 0, 0), the count value "2" maps to the 8-bit information (0, 0, 0, 0, 0, 0, 0, 1), the count value "3" maps to the 8-bit information (0, 0, 0, 0, 0, 0, 1, 0), . . . , the count value "255" maps to the 8-bit information (1, 1, 1, 1, 1, 1, 1, 0), and the count value "256" maps to the 8-bit information (1, 1, 1, 1, 1, 1, 1, 1). FIG. 10 is a diagram illustrating the states S0-S15 and the corresponding MSBs and LSBs according to one embodiment of the present invention. In the embodiment shown in FIG. 10, the MSBs are used to indicate the state of the memory cell M(1, 1, Nz), that is MSBs (0, 0, 0, 0) represent the state 50, MSBs (0, 0, 0, 1) represent the state S1, MSBs (0, 0, 1, 0) represent the state S2, . . . , MSBs (1, 1, 1, 0) represent the state S14, and MSBs (1, 1, 1, 1) represent the state S15. In addition, the range defined by the MSBs is further divided into sixteen sub-ranges represented by the LSBs, and the LSBs can serve as the soft bits mentioned above.

Figure 11:
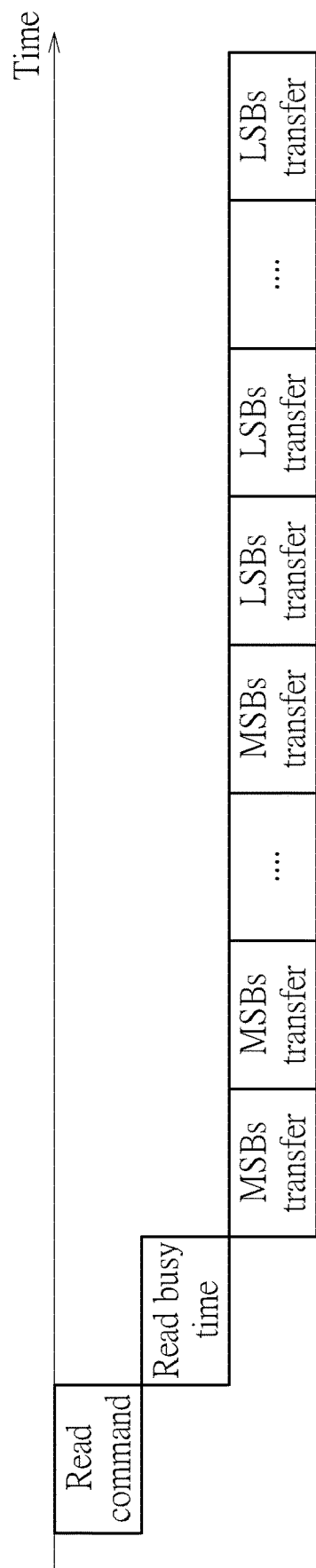
FIG. 11 is a diagram illustrating the read command and the MSBs/LSBs transfer according to one embodiment of the present invention.

In one embodiment, the flash memory module 120 can transmit the MSBs and LSBs to the flash memory controller 110 in one read command. Refer to FIG. 11, if the flash memory controller 110 wants to read data within a page (e.g. one logical page), the flash memory controller 110 transmits a read command to the flash memory module 120, and the flash memory module 120 uses the above-mentioned mechanism to read the memory cells of the page to generate MSBs and LSBs for each memory cell. Assuming that the page comprises four sectors/chunks and each sector/chunk is an encode/decode unit, the flash memory module 120 can sequentially transmit the MSBs of each memory cell within a first sector/chunk, the MSBs of each memory cell within a second sector/chunk, the MSBs of each memory cell within a third sector/chunk and the MSBs of each memory cell within a fourth sector/chunk to the flash memory controller 110 for the further de-randomizing operations and decoding operations. After the MSBs of all of the memory cells of the page are transmitted to the flash memory controller 110, the flash memory module 120 starts to sequentially transmit the LSBs of each memory cell within the first sector/chunk, the LSBs of each memory cell within the second sector/chunk, the LSBs of each memory cell within the third sector/chunk and the LSBs of each memory cell within the fourth sector/chunk to the flash memory controller 110 for the further de-randomizing operations and decoding operations.

In the above-mentioned embodiment, if the decoder 134 of the flash memory controller 110 can successfully decode the data by only using the MSBs of the memory cells of the page, the LSBs of the memory cells may not be used for the decoding operations, or the flash memory controller 110 can notify the flash memory module 120 to stop transferring the LSBs.

In one embodiment, although the flash memory module 120 obtains the MSBs and LSBs of the memory cells in response to one read command from the flash memory controller 110, the flash memory module 110 may not automatically transmits the LSBs of the memory cells to the flash memory controller 110 until the flash memory controller 110 asks for the LSBs.

Figure 12:
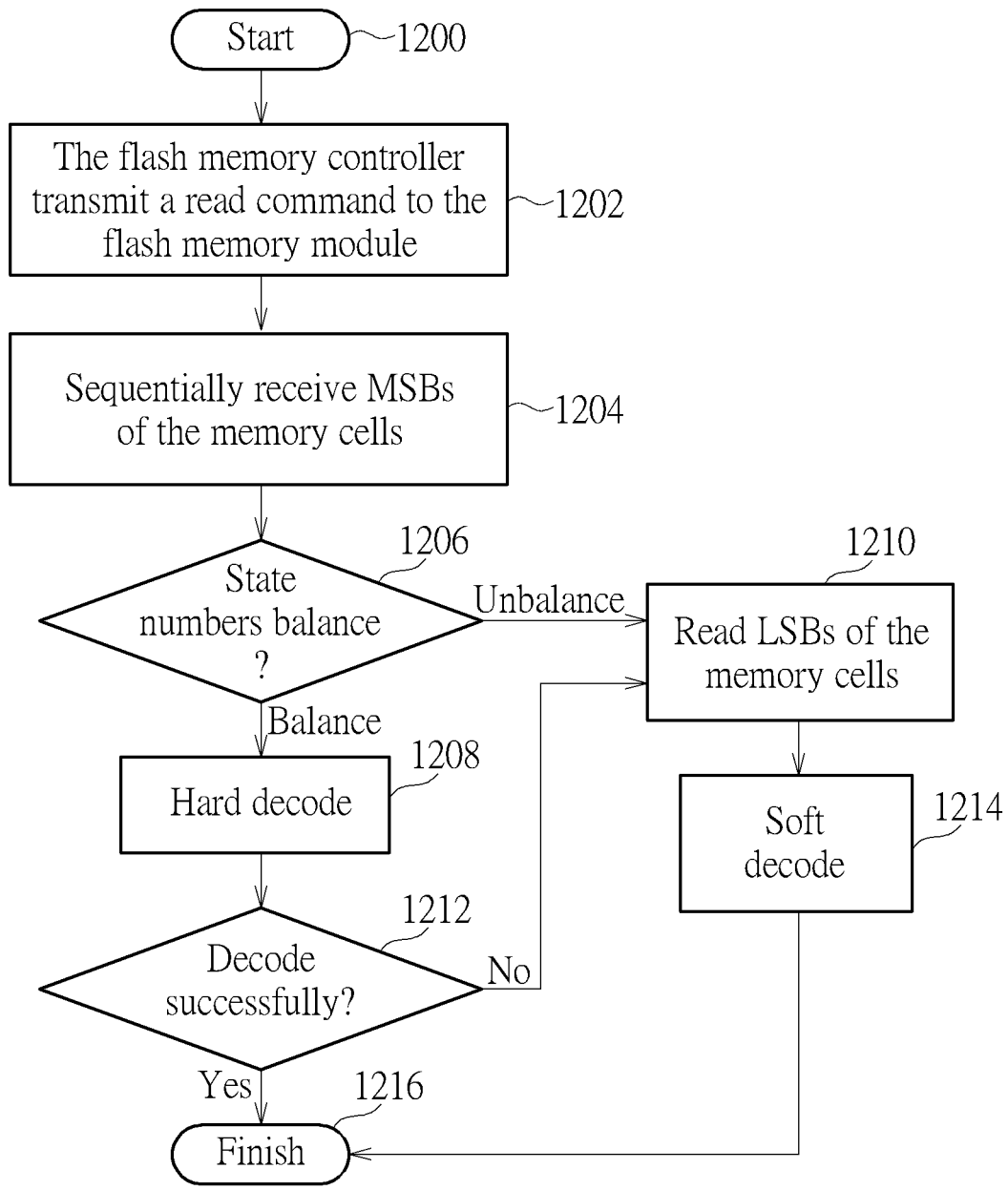
FIG. 12 is a flowchart of a method for accessing the flash memory module according to one embodiment of the present invention.

FIG. 12 is a flowchart of a method for accessing the flash memory module 120 according to one embodiment of the present invention. In Step 1200, the flow starts, and the host device 50 and the memory device 100 are powered on. In Step 1202, the flash memory controller 110 sends a read command to the flash memory module 120 and asks for data of a page. In Step 1204, the flash memory module 120 receives the read command, and uses the read mechanism shown in FIG. 7-FIG. 10 to read all of the memory cells of the page, and obtains the MSBs and LSBs of each memory cell. Assuming that the page has a plurality of chunks and each chunk is the encode/decode unit, the flash memory module 120 sequentially transmits the MSBs of each memory cell within a first chunk, the MSBs of each memory cell within a second chunk, . . . , and the MSBs of each memory cell within a last chunk to the flash memory controller 110. In this embodiment, the MSBs of each memory cell can be regarded as the state information indicating which state the memory cell has. In Step 1206, in the process of receiving data sequentially from the flash memory module 120, the flash memory controller 110 determines if numbers of the states of part of the memory cells are balance or unbalance to generate a determination result, and if the determination result indicates that the numbers of the states of part of the memory cells are balance, the flows enters Step 1208; and if the determination result indicates that the numbers of the states of part of the memory cells are unbalance, the flows enters Step 1210.

Figure 13:
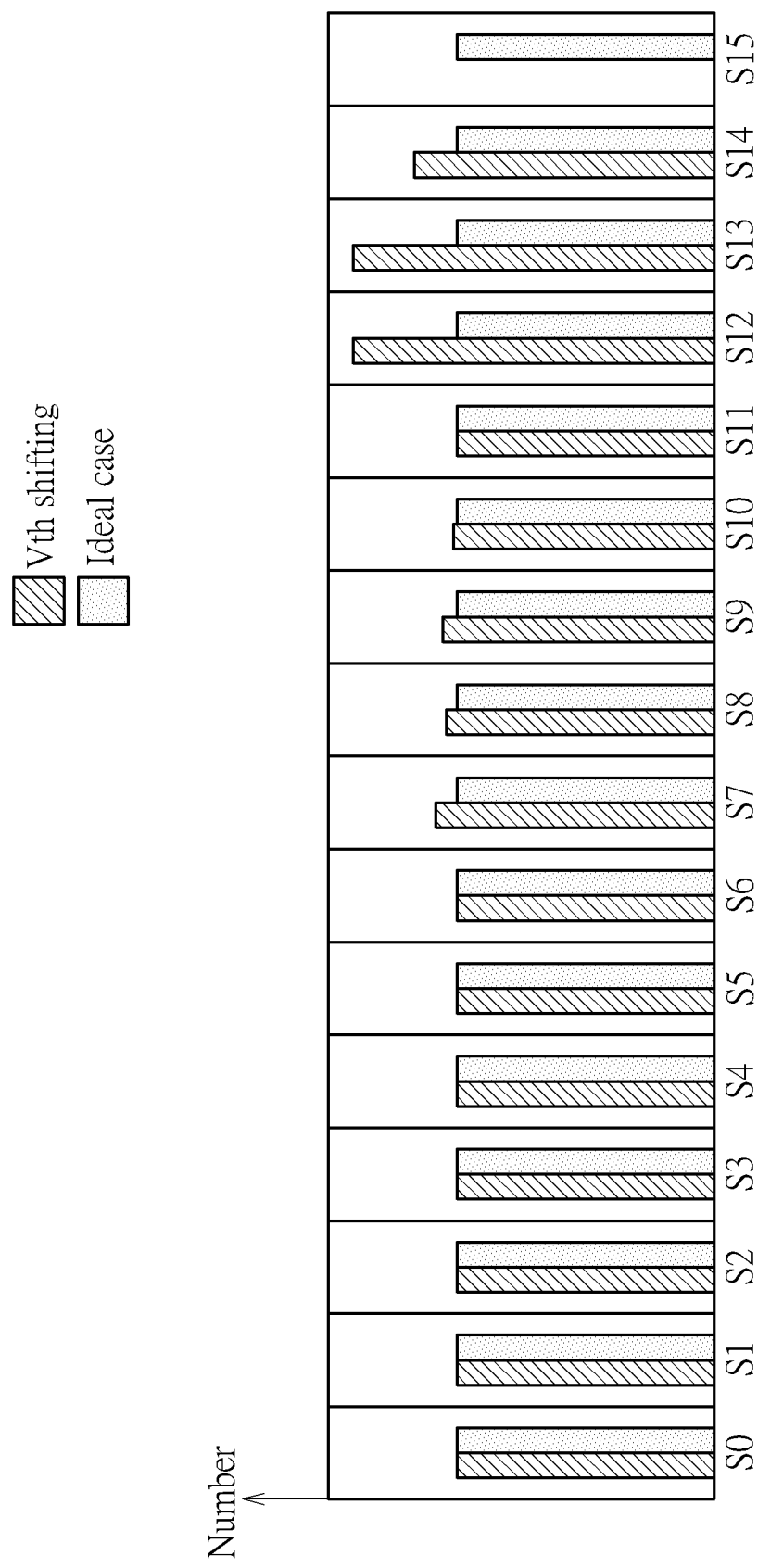
FIG. 13 is a histogram of the states of the memory cells according to one embodiment of the present invention.

Specifically, because the MSBs transmitted from the flash memory module 120 can be regarded as a state that the memory cell has, so the flash memory controller 110 can accumulate the number of the states S0-S15 during the process of receiving the MSBs of the memory cells sequentially. Ideally, because the data programmed into the flash memory module 120 is processed by the randomizer 136, the numbers of the states S0-S15 should be close to each other. For example, if the flash memory controller 110 receives the MSBs of sixteen thousand memory cells from the flash memory module 120, the number of each of the states S0-S15 of the sixteen thousand memory cells should be about "1000". If the difference(s) between the numbers of the states is/are within a defined range, the numbers of the states are determined to be balance; and if the difference(s) between the numbers of the states is/are not within the defined range, the numbers of the states are determined to be unbalance. For example, the flash memory controller 110 may build a histogram shown in FIG. 13. As shown in FIG. 13, ideally the states S0-S15 have the similar numbers, and if the page suffers the data retention or read disturbance issue, the memory cells may have the threshold value shifting issue. In the example shown in FIG. 13, the state S15 is shifted to other states such as S12-S14, so the sense amplifier does not sense the state S15 from any memory cell, and the phenomenon of this threshold value shifting issue cause the unbalance state numbers.

If the flash memory controller 110 determines that the numbers of the states of part of the memory cells are balance, the flow enters the Step 1208 and the decoder 134 decodes data by using the MSBs of the memory cells belonging to a chunk (i.e. hard decoding). If the flash memory controller 110 determines that the numbers of the states of part of the memory cells are unbalance, the flow enters the Step 1210 and the flash memory controller 110 sends a signal to trigger the flash memory module 120 to transmit the LSBs of the memory cells. After reading the LSBs of the memory cells from the flash memory module 120, in Step 1214, the decoder 134 decodes data by using the MSBs and the LSBs of the memory cells belonging to a chunk (i.e. soft decoding).

In Step 1212, it is determined if the decoder 134 decodes the data successfully. If the decoder 134 decodes the data successfully, the flow enters Step 1216 to finish the reading operations or begin a next read operation; and if the decoder 134 fails to decode the data, the flow enters Step 1210 to send the signal to trigger the flash memory module 120 to send the LSBs of the memory cells.

In the flowchart shown in FIG. 12, if it is determined that the numbers of the states of part of the memory cells are balance, the flash memory controller 110 can directly perform the hard decoding operations upon the MSBs of the memory cells, and the LSBs of the memory cells temporarily stored in the flash memory module 120 is transmitted to the flash memory controller 110 only if the hard decoding operations fail. Therefore, the unnecessary data transmission can be avoided to save bandwidth and power. In addition, if it is determined that the numbers of the states of part of the memory cells are unbalance, the flash memory controller 110 can directly perform the soft decoding operations upon the MSBs and LSBs of the memory cells, without performing the hard decoding operations first, to avoid wasting power and time on the hard decoding operations with higher failure rate.

It is noted that the details of the hard decoding operations and the soft decoding operations are known by a person skilled in the art, and the detailed steps of the hard decoding operations and the soft decoding operations are not the topics of the present invention, so further descriptions are therefore omitted here.

Figure 14:
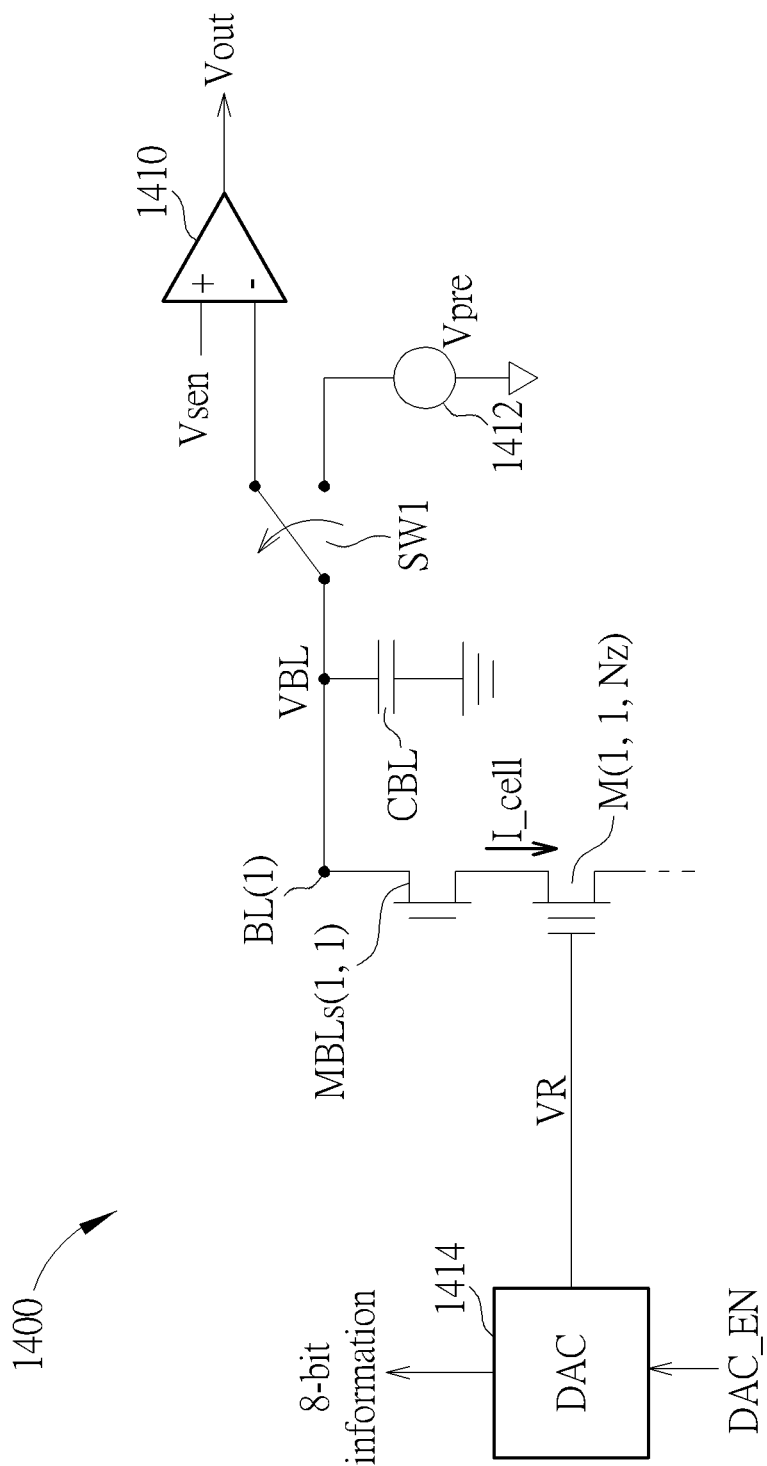
FIG. 14 is a diagram illustrating a sense amplifier according to a second embodiment of the present invention.

FIG. 14 is a diagram illustrating a sense amplifier 1400 according to a second embodiment of the present invention. In FIG. 14, the sense amplifier 1400 comprises an operational amplifier 1410, a voltage source 1412, a digital-to-analog converter 1414 and a switch SW1. In this embodiment, the sense amplifier 1400 is arranged to read the memory cell M(1, 1, Nz) corresponding to the bit line BL(1) and the word line WL(1, Nz) shown in FIG. 1. When the memory cell M(1, 1, Nz) is to be read, the DAC 1214 is configured to generate the read voltage VR to the memory cell M(1, 1, Nz) shown in FIG. 1, and the other memory cells M(1, 1, 1)–M(1, 1, (Nz−1)) are controlled to be conductive.

Figure 15:
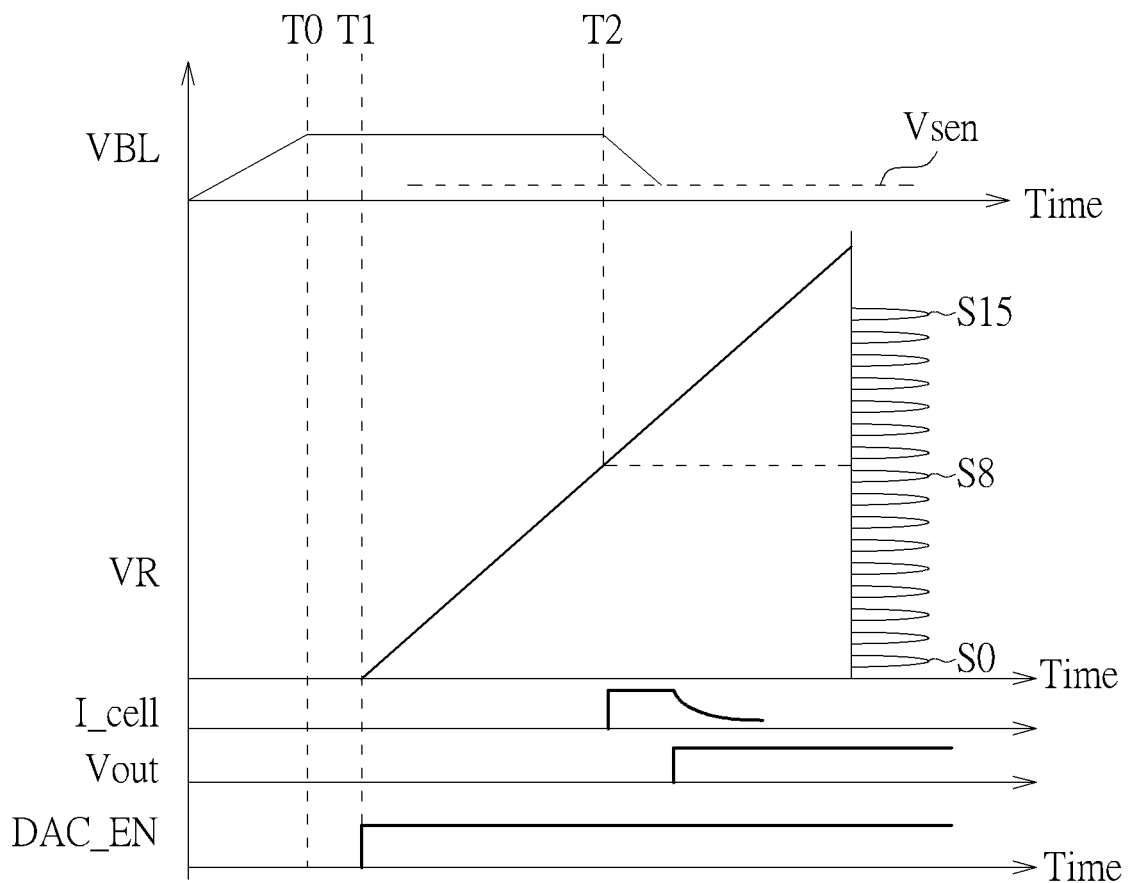
FIG. 15 is a timing diagram of some signals of the sense amplifier shown in FIG. 14 according to one embodiment of the present invention.

Refer to FIG. 14 and FIG. 15 together, FIG. 15 is a timing diagram of some signals of the sense amplifier 1400 according to one embodiment of the present invention. In the operations of the sense amplifier 1400, initially the DAC 1414 does not work and the read voltage VR is equal to zero (i.e. the memory cell M(1, 1, Nz) is disabled), the switch SW1 is controlled to connect the bit line BL(1) to the voltage source 1412, and the voltage source 1412 starts to charge the parasitic capacitor CBL to make the voltage VBL at one terminal of the parasitic capacitor CBL be equal to a voltage Vpre provided by the voltage source 1412 at the time T0. Then, at the time T1, the switch SW1 is controlled to connect the bit line BL(1) to the negative terminal of the operational amplifier 1410, the DAC 1414 starts to generate a ramp signal serving as the read voltage VR to the word line WL(1, Nz) to control the memory cell M(1, 1, Nz). For example, assuming that the memory cell M(1, 1, Nz) stores the data corresponding to the state S8 whose threshold voltage is about 3V, when the read voltage VR starts to go high from 0V to 3V, because the read voltage VR is not high enough to enable the memory cell M(1, 1, Nz), the voltage VBL keeps at the voltage Vpre, and the output signal Vout generated by the operational amplifier 1410 is equal to "0" because the voltage VBL/Vpre is greater than a reference voltage Vsen at the positive terminal of the operational amplifier 1410. When the read voltage VR is greater than the threshold voltage of the memory cell M(1, 1, Nz), the memory cell M(1, 1, Nz) is enabled to generate a current I_cell to discharge the parasitic capacitor CBL, and the voltage VBL is decreased. When the voltage VBL is decreased to be lower than the reference voltage Vsen, the output signal Vout becomes "1" to trigger the DAC 1414 to output the digital value corresponding to the current read voltage VR.

It is noted that although FIG. 15 shows using the ramp signal to serve as the read voltage VR, it's not a limitation of the present invention. In other embodiments, the DAC 1414 can apply the read voltage VR with different voltage levels to the memory cell M(1, 1, Nz) (i.e. the read voltage VR with different voltage levels can be regarded as a plurality of read voltages), the read voltage VR may have any other suitable designs. In one embodiment, the quantity of the voltage levels of the read voltage VR (or quantity of the read voltages) is equal to or greater than quantity of the states of the memory cell M(1, 1, Nz).

In the embodiments shown in FIG. 14 and FIG. 15, the digital value outputted by the DAC 1414 can represent the threshold voltage of the memory cell M(1, 1, Nz) (i.e. an analog voltage corresponding to the digital value outputted by the DAC 1414 is much close to the threshold voltage of the memory cell M(1, 1, Nz)), so the digital value can be effectively used for the following decoding operations. In addition, assuming that the DAC 1414 is the 8-bit DAC, the digital value may have the four MSBs and four LSBs shown in FIG. 10, and the flash memory module 120 can directly transmit the digital value (i.e. MSBs and LSBs) to the flash memory controller 110 in one read command. The timing diagram of the read command and the MSBs/LSBs transfer may refer to FIG. 11. In addition, because of the circuit delay and the discharging time, the digital value outputted by the DAC 1414 may be slightly adjusted to make the adjusted digital value be closer to the threshold voltage of the memory cell M(1, 1, Nz).

The above embodiments take QLC block as an example, however, the above-mentioned read mechanism can also be applied to TLC blocks, MLC blocks and SLC blocks. A person skilled in the art should understand how to use the above-mentioned steps to read the memory cells within the TLC blocks, MLC blocks or SLC blocks, further descriptions are therefore omitted here.

Briefly summarized, in the flash memory controller and the flash memory module of the present invention, the flash memory module can output the multi-bit information of each memory cell to the flash memory controller in response to only one read command, and the multi-bit information of each memory cell may indicate a threshold voltage or a state of the memory cell. Therefore, the read efficiency can be greatly improved. In addition, in the decoding operations of the flash memory controller, the decoder can determine if the numbers of the states are balance or unbalance to adopt different decoding mechanisms, to improve the decoding efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory controller, wherein the flash memory controller is coupled to a flash memory module, the flash memory module comprises at least one flash memory chip, each flash memory chip comprises a plurality of blocks, each block comprises a plurality of pages, and the flash memory controller comprising:
  a memory, for storing a program code; and
  a microprocessor, for executing the program code to access the flash memory module via a control logic;
  wherein after the microprocessor sends a read command to the flash memory module to ask for data on at least one memory unit, the control logic analyzes state information of a plurality of memory cells of the memory unit based on information from the flash memory module to determine a decoding method adopted by a decoder within the control logic;
  wherein each memory cell of the at least one memory unit is configured to store a plurality of bits, each memory cell supports a plurality of states, the states are used to indicate different combinations of the plurality of bits, and each memory cell has only one state of the plurality of states; and the state information comprises numbers of states of the plurality of memory cells.

2. The flash memory controller of claim 1, wherein the control logic receives the state information of the plurality of memory cells from the flash memory module.

3. The flash memory controller of claim 2, wherein the control logic determines if the numbers of states of the plurality of cells are balance or unbalance to generate a determination result; if the determination result indicates that the numbers of the states of the plurality of cells are balance, the decoder uses a first decoding method to decode data received from the flash memory controller; and if the determination result indicates that the numbers of the states of the plurality of cells are unbalance, the decoder uses a second decoding method to decode the data received from the flash memory controller.

4. The flash memory controller of claim 3, wherein the first decoding method is a hard decoding method, and the second decoding method is a soft decoding method.

5. The flash memory controller of claim 4, wherein if the determination result indicates that the numbers of the states of the plurality of cells are balance, the decoder uses the first decoding method to decode data received from the flash memory controller, wherein the data is obtained only from the state information of the plurality of cells; and if the determination result indicates that the numbers of the states of the plurality of cells are unbalance, the decoder uses the second decoding method to decode the data by using the state information of the plurality of cells and other information received from the flash memory module.

6. The flash memory controller of claim 5, wherein and each state is divided into a plurality of sub-ranges, and the other information is soft information indicating which sub-range of the state the memory cell has.

7. The flash memory controller of claim 5, wherein if the determination result indicates that the numbers of the states of the plurality of cells are unbalance, the decoder directly uses the second decoding method to decode the data by using the state information of the plurality of cells and other information received from the flash memory module, without using the first decoding method.

8. The flash memory controller of claim 5, wherein if the determination result indicates that the numbers of the states of the plurality of cells are unbalance, the control logic sends a signal to trigger the flash memory module to transmit the other information to the flash memory controller, and then the decoder uses the second decoding method to decode the data by using the state information of the plurality of cells and the other information received from the flash memory module.

9. The flash memory controller of claim 3, wherein if the decoder fails to use the first decoding method to decode the data, the control logic sends a signal to trigger the flash memory module to transmit other information to the flash memory controller, and then the decoder uses the second decoding method to decode the data by using the state information of the plurality of cells and the other information received from the flash memory module.

10. A method for accessing a flash memory module, wherein the flash memory module comprises at least one flash memory chip, each flash memory chip comprises a plurality of blocks, each block comprises a plurality of pages, and the method comprises:
  sending a read command to the flash memory module to ask for data on at least one memory unit; and analyzing state information of a plurality of memory cells of the memory unit based on information from the flash memory module to determine a decoding method adopted by a decoder;

wherein each memory cell of the at least one memory unit is configured to store a plurality of bits, each memory cell supports a plurality of states, the states are used to indicate different combinations of the plurality of bits, and each memory cell has only one state of the plurality of states; and the state information comprises numbers of states of the plurality of memory cells.

11. The method of claim 10, further comprising:

receiving the state information of the plurality of memory cells from the flash memory module.

12. The method of claim 11, wherein the step of analyzing the state information of the plurality of memory cells to determine the decoding method adopted by the decoder comprises:

determining if the numbers of states of the plurality of cells are balance or unbalance to generate a determination result;

if the determination result indicates that the numbers of the states of the plurality of cells are balance, the decoder uses a first decoding method to decode data received from the flash memory controller; and if the determination result indicates that the numbers of the states of the plurality of cells are unbalance, the decoder uses a second decoding method to decode the data received from the flash memory controller.

13. The method of claim 12, wherein the first decoding method is a hard decoding method, and the second decoding method is a soft decoding method.

14. The method of claim 13, wherein the step of the decoder using the first decoding method to decode data received from the flash memory controller comprises:

if the determination result indicates that the numbers of the states of the plurality of cells are balance, the decoder uses the first decoding method to decode data received from the flash memory controller, wherein the data is obtained only from the state information of the plurality of cells;

the step of the decoder using the second decoding method to decode the data received from the flash memory controller comprises:

if the determination result indicates that the numbers of the states of the plurality of cells are unbalance, the decoder uses the second decoding method to decode the data by using the state information of the plurality of cells and other information received from the flash memory module.

15. The method of claim 14, wherein the other information is soft information indicating which sub-range of the state the memory cell has.

16. The method of claim 14, wherein the step of the decoder using the first decoding method to decode data received from the flash memory controller comprises:

if the determination result indicates that the numbers of the states of the plurality of cells are unbalance, the decoder directly uses the second decoding method to decode the data by using the state information of the plurality of cells and other information received from the flash memory module, without using the first decoding method.

17. The method of claim 14, wherein the step of the decoder using the first decoding method to decode data received from the flash memory controller comprises:

if the determination result indicates that the numbers of the states of the plurality of cells are unbalance, sending a signal to trigger the flash memory module to transmit the other information to the flash memory controller, and then the decoder uses the second decoding method to decode the data by using the state information of the plurality of cells and the other information received from the flash memory module.

18. The method of claim 12, further comprising:

if the decoder fails to use the first decoding method to decode the data, sending a signal to trigger the flash memory module to transmit other information to the flash memory controller; and using the second decoding method to decode the data by using the state information of the plurality of cells and the other information received from the flash memory module.

* * * * *